United States Patent [19]

Audic et al.

[11] Patent Number: 5,057,679

[45] Date of Patent: Oct. 15, 1991

[54] TECHNIQUE FOR ATTACHING AN ELECTRONIC MODULE TO A CARD BODY TO FORM AN ELECTRONIC MEMORY CARD

[75] Inventors: Bernard Audic, Clamart; Christian Bugeia, Blois, both of France

[73] Assignee: Schlumberger Industries, Montrouge, France

[21] Appl. No.: 325,321

[22] Filed: Mar. 17, 1989

[30] Foreign Application Priority Data

Mar. 22, 1988 [FR] France ................... 88 03695

[51] Int. Cl.$^5$ .................... G06K 19/077; G06K 19/07
[52] U.S. Cl. ........................ 235/492; 235/488
[58] Field of Search ............... 235/488, 487, 492, 380; 283/904; 361/392, 400, 401, 403, 417, 418

[56] References Cited

U.S. PATENT DOCUMENTS

| | | | |
|---|---|---|---|
| 4,222,516 | 9/1980 | Badet et al. | 235/487 |
| 4,603,249 | 7/1986 | Hoppe et al. | 235/492 |
| 4,625,102 | 11/1986 | Rebjock | 235/492 |
| 4,701,236 | 10/1987 | Vieilledent | 283/904 |
| 4,737,620 | 4/1988 | Mollet et al. | 235/492 |
| 4,758,689 | 7/1988 | Nakao et al. | 235/488 |
| 4,774,633 | 9/1988 | Dehaine et al. | 235/492 |
| 4,841,134 | 6/1989 | Hida et al. | 235/488 |
| 4,897,534 | 1/1990 | Haghiri-Tehrani | 235/488 |

FOREIGN PATENT DOCUMENTS 2605144 10/1986 France .

Primary Examiner—Stuart S. Levy
Assistant Examiner—Robert Weinhardt
Attorney, Agent, or Firm—Frishauf, Holtz, Goodman & Woodward

[57] ABSTRACT

In order to fix the electronic module (14) in the cavity (12, 14, 16) of a card body (10), a fixing ring (20) is placed on a shoulder (18) in the cavity. The ring (20) comprises a fibrous matrix structure impregnated with a thermally-activatable adhesive material. Pressure is exerted on the electronic module (14), thereby crushing the ring (20) and positioning the module. Heat is applied to the fixing element in order to activate and polymerize the adhesive material contained therein.

5 Claims, 2 Drawing Sheets

TECHNIQUE FOR ATTACHING AN ELECTRONIC MODULE TO A CARD BODY TO FORM AN ELECTRONIC MEMORY CARD

The present invention relates to a method of making an electronic memory card, and to a card obtained by implementing the method.

BACKGROUND OF THE INVENTION

An electronic memory card essentially comprises a card body which is generally rectangular in shape and an electronic module fixed inside the card body. The card body which is made of a thermoplastic material such as polyvinyl chloride (PVC) has two main faces which are substantially parallel to each other. The electronic module generally comprises an insulating support with contact tabs external to the card being formed on one face thereof, together with a semiconductor chip fixed on the opposite face of the insulating support and electrically connected to the external contact tabs.

There are numerous types of method for fixing the electronic module in the card body. One of these methods consists in making a cavity in the card body, in placing the electronic module in the cavity, and in gluing it in such a manner that the external contact tabs of the electronic module lie substantially in the same plane as one of the main faces of the card body.

Gluing an electronic module to the card body is a difficult procedure. The gluing must be good enough to enable the card to pass standard bending tests, but it must nevertheless avoid giving rise to additional operations that could increase the manufacturing cost of the card appreciably.

In addition, while performing a gluing operation, it is highly desirable to be able to accomodate dispersion in the dimensions of cavities in card bodies and of electronic modules so that, after gluing, the external contact tabs always lie in the same plane as one of the main faces of the card body.

European patent application number 201 952 filed in the name of RTC Compelec describes a gluing method which consists in using a strip of adhesive material which is adhesive on both faces.

Such a method is difficult to perform specifically because the strip of adhesive is adhesive on both faces. In addition, it cannot compensate for dispersion in dimensions in the thickness direction either on the electronic module or in the cavity.

An object of the present invention is to provide a method of making an electronic memory card which enables the electronic module to be fixed to the card body by means of operations which are simpler than those of the prior art.

SUMMARY OF THE INVENTION

This object is achieved by a method of making a memory card comprising a card body having a main face and an electronic module including a support with external electrical contact tabs on one of its faces and a semiconductor chip on its other face, the method comprising the following steps:

a card body is provided having a cavity opening out into a main face of the card body;

a fixing element is placed in a portion of the cavity, said fixing element having two faces of thermally activatable adhesive material;

said electronic module is placed in said cavity in such a manner that one face of said fixing element comes into contact with a portion of said support; and energy is applied to said fixing element in order to glue one face of the fixing element to said support and the other face of said element to said card body.

Another object of the invention is to provide a method of making an electronic memory card which enables the electronic module to be accurately positioned in the thickness direction within the card body.

In order to achieve this object, the method preferably further includes said fixing element being of a thickness that can be modified under the effect of pressure, and pressure being applied to a portion of said module simultaneously with the application of said energy, thereby modifying the thickness of said fixing element until said contact tabs lie substantially in the same plane as the main face of said body, with said pressure being maintained until said fixing element provides secure adhesion, thereby retaining said modified thickness of said fixing element.

Another object of the invention is to provide an electronic memory card as obtained by implementing the manufacturing method of the invention.

BRIEF DESCRIPTION OF THE DRAWINGS

Embodiments of the invention are described by way of example with reference to the accompanying drawings, in which.

DETAILED DESCRIPTION

Figure 1:
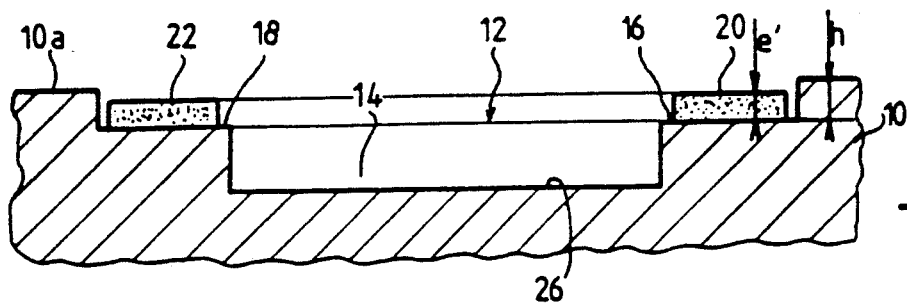
FIG. 1 is a vertical section through a portion of a card body with the fixing element in place.
Figure 2:
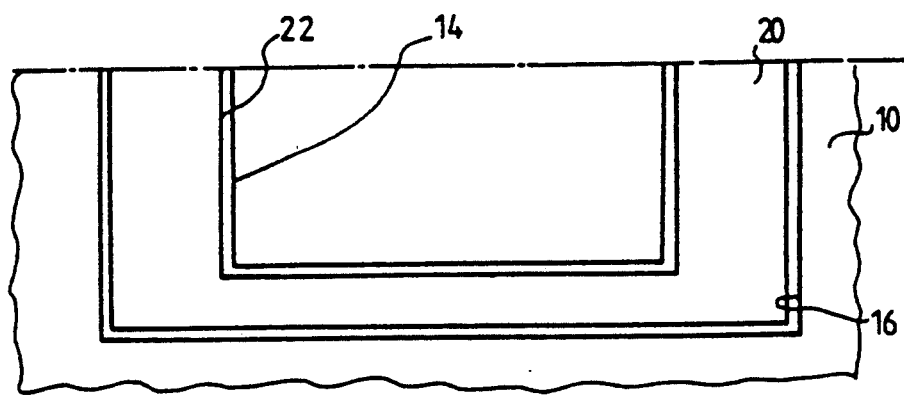
FIG. 2 is a plan half-view of the card body shown in FIG. 1.

A first embodiment of an electronic memory card in accordance with the invention is described with reference to FIGS. 1 to 4.

The method begins with a card body 10 having a cavity 12. The cavity 12 is stepped, i.e. it comprises a bottom housing 14 and a top housing 16 occupying a larger area. The cavity 12 thus includes a shoulder 18 surrounding the bottom cavity 14.

In a first step, a fixing element 20 is placed on the shoulder 18, with said fixing element being substantially in the form of a ring. In plan view, the shape of this element corresponds to the shape of the shoulder 18, i.e. it has a central opening 22 which is the same shape in plan view as the bottom housing 14. The fixing element 20 is cut from a strip of thermal-adhesive material constituted by a fibrous matrix structure impregnated with a thermoactivatable adhesive. At ambient temperature, the fixing element 20 is therefore not "sticky" and it can be handled without taking special precautions. A suitable material is ABLE film 561, for example, as sold by the ABLE Corporation. This material is in sheet or strip form having a thickness of about 0.1 mm. It comprises a fiberglass matrix structure impregnated with epoxy resin. The matrix structure may be woven or nonwoven and constitutes a matrix which may be compressed and crushed to a small extent in order to compensate various dimensional differences. However, the structure ensures that the degree of crushing due to such compression is uniform over its entire area.

Figure 3:
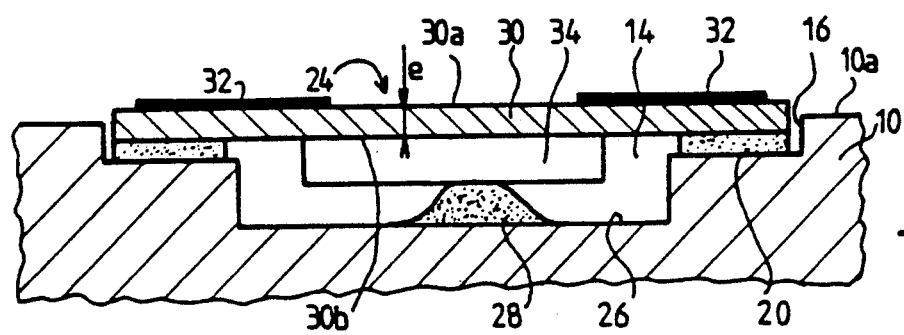
FIGS. 3 and 4 show an electronic module being put into place and fixed in the card body shown in FIGS. 1 and 2.

During the next step, as shown in FIG. 3, an electronic module 24 is put into place in the cavity 12. Prior to this step, a drop of adhesive 28 is placed on the bottom 26 of the cavity 12. There are various different possible structures for the electronic module 24 depending on which of the various now well-known technologies is being used.

In any event, the module 24 includes an insulating support 30. One face 30a of the support has external electrical contact tabs 32 formed thereon. A semiconductor chip 34 is fixed on the other face 30b of the insulating support. French patent applications numbers 83/18993, 85/04658, and 86/14231 describe such modules.

Electrical connections, not shown in FIG. 3, serve to provide electrical interconnections between the terminals of the chip 34 and the contact tabs 32. The chip 34 and the connection wires are embedded in a protective material which may be molded to impart any appropriate outside shape thereto. In plan view, the dimensions of the insulating support 30 for the electronic module 24 are slightly smaller than the corresponding dimensions of the top housing 16. In plan view, therefore, the insulating support 30 enters completely into the housing 16. The periphery of the insulating support 30 rests on the top face of the fixing element 20. The thickness e of the insulating support 30 is less than the depth h of the housing 16. The thickness e' of the fixing element 20 is also less than the depth h of the housing 16. However, the depth h is less than the sum of the thicknesses e and e'. Consequently, as can be seen in FIG. 3, the face 30a of the insulating support stands above the top face 10a of the card body 10. In addition, the drop of adhesive 28 occupies only a small fraction of the portion of the cavity 12 which is not occupied by the module 24. It is important to ensure that the material in which the electronic module is embedded does not overlap that portion of the periphery of the insulating support 30 which is to come into contact with the fixing element 20. It is therefore advantageous for said material to be put into place by molding so as to be able to define its outside shape exactly. A first technique consists in injection molding a thermoplastic material. A second technique consists in "transfer" molding. During a first stage, powdered embedding material (e.g. epoxy resin) is heated so as to become liquid. This liquid is inserted into the mold cavity for defining the outside shape of the embedded circuit, and the material is polymerized.

Figure 4:
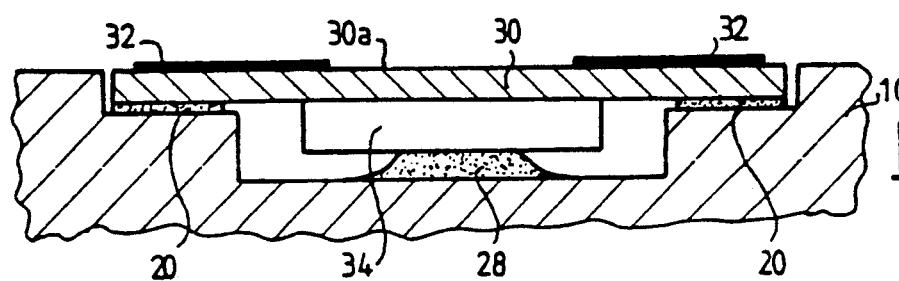

In the next step shown in FIG. 4, pressure is applied to the top face 30a of the module in order to crush the fixing element 20 until the top face 30a of the module lies substantially in the same plane as the top face 10a of the card body 10. Such crushing is made possible by virtue of the fibrous matrix structure in the fixing element 20 being crushable. Simultaneously, the electronic module 24 is heated locally in order to activate the adhesive material of the fixing element 20 and, possibly, to activate the drop of resin 28. Once the adhesive material has polymerized sufficiently, pressure may be removed from the module. A temperature of about 120° C. to 150° C. needs to be maintained for a period of about 3 to 4 seconds. After the adhesive material in the fixing element has polymerized and hardened, not only is the periphery of the insulating support 30 effectively stuck to the card body 10, but also the hardening of this material ensures that the appropriate degree of crushing in the fibrous structure of the fixing element 20 is maintained so that the top face 30a of the insulating support continues to be properly positioned within the tolerances laid down. Energy may be applied by any appropriate means: a hot-press tool, ultrasound, infrared radiation, pulsed hot air, etc. . . . .

It will be understood that this technique not only makes it easier to fix the electronic module on the card body by implementing steps which are simpler than those needed for an adhesive strip having two adhesive faces, but also achieves very accurate positioning of the contact tabs 32 relative to the top face 10a of the card body. In addition, since the adhesive material of the fixing element 20 is imprisoned in the fibrous structure, it cannot run and be squeezed out while pressure is being applied.

During heating, the drop of resin 28 may also be polymerized. As shown in FIG. 4, the drop 28 thus fixes the card body to the face of the electronic module which is not fixed to the insulating support 30. It should be observed that the drop of epoxy resin 28 may be small in volume since its sole purpose is to provide a connection between the electronic module and the bottom 26 of the cavity 12. There is no need for it to fill the cavity 12. As a result, even if the volume of the drop of epoxy is not defined very accurately, there is no danger of the epoxy resin overflowing from the cavity 12 when the electronic module 12 is put into place. If the electronic module is embedded by a molding technique, then its outside shape is accurately controlled. The empty volume remaining in the cavity 12 is then also well defined. This makes it easier to control the quantity of glue to be used for forming the drop 28.

Figure 5:
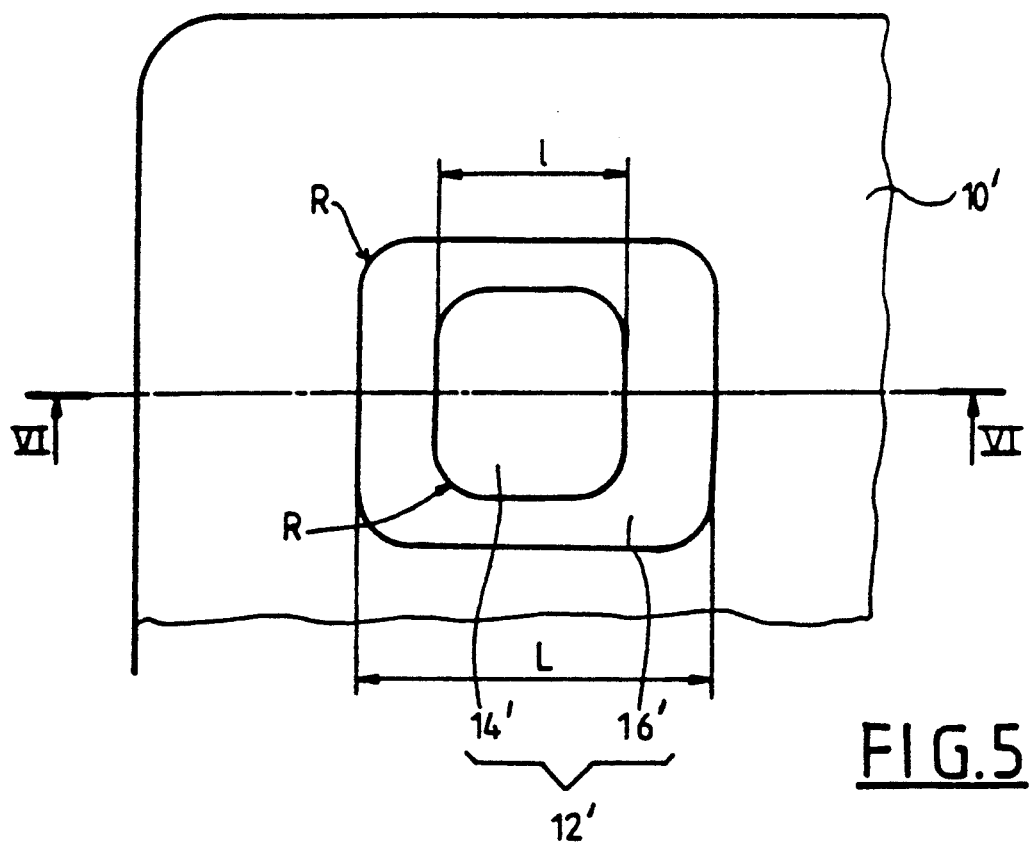
FIG. 5 is a plan view of a variant embodiment of the cavity in the card body.
Figure 6:
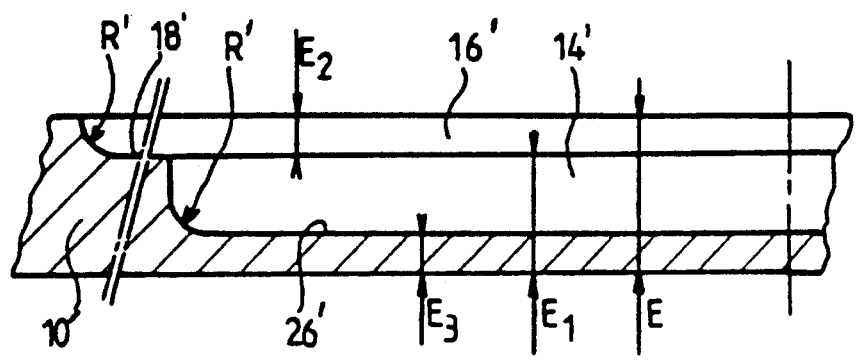
FIG. 6 is a section view through the card body on line VI—VI of FIG. 5.

FIGS. 5 and 6 show a variant embodiment of the cavity 12 in the card body 10. These figures use the same references as used in FIGS. 1 to 4, plus a "prime" symbol.

The difference over the embodiments shown in FIGS. 1 to 4 lies solely in the fact that the various portions of the cavity 12', i.e. its housings 14' and 16', are delimited by surfaces which run into one another via curved fillets, instead of meeting at right angles.

FIG. 5 shows that the vertical walls around each of the housings 14' and 16', i.e. the walls extending through the thickness of the card body, are interconnected by curves having a radius of curvature R of about 1.75 mm. For comparison purposes, the leading dimensions l and L of the cavity 12' are respectively equal to 7.5 mm and 13.2 mm.

Similarly, the connections between the bottom 26' of the cavity 12' and the "vertical" walls of the housing 14', and also the connections between the shoulder 18' and the "vertical" walls of the housing 16' are provided via curves having a radius of curvature R' of about 0.2 mm. By way of comparison, the thickness of E of the card body is 0.8 mm, the depth $E_1$ of the housing 14' is 0.38 mm, and the depth $E_2$ of the housing 16' is 0.2 mm.

These curved fillets serve to reduce local stresses at the connections between the surfaces delimiting the cavity 12'. In addition, the connection curves to the bottom 26' also serve to increase the mechanical bending strength of that portion of the card body which separates the cavity bottom 26' from the rear face 10'b of the card body. This disposition is particularly advantageous since this portion of the card body is thin, having a thickness $E_3$ of 0.22 mm.

It should also be observed that the adhesive material 28 which connects the bottom 26' of the cavity to the electronic module 14 improves the mechanical strength of this portion of the card body and constitutes thermal insulation between the card body and the integrated circuit formed in the semi-conductor chip together with and the material in which it is embedded in order to avoid deforming the rear face of the card body. It is therefore advantageous to choose an adhesive which is a good thermal insulator.

We claim:

1. A method of making an electronic memory card comprising a card body having a main face, and an electronic module including a support having two faces, electrical contact tabs on a first of said two faces and a semiconductor chip fixed on a second of said two faces, the method comprising the steps of:

providing a card body having formed therein a cavity opening out into said main face thereof;

providing a fixing element constituted of a fibrous matrix structure impregnated with a thermal activatable adhesive and having a thickness that can be modified under the effect of pressure, said fixing element being ring-shaped and having two faces;

placing said fixing element in a portion of said cavity;

placing said electronic module into said cavity in such a manner that one face of said two faces of said fixing element comes into contact with a portion of the second face of said support which surrounds said semiconductor chip;

sizing the respective thicknesses of said fixing element and said support so that the first face of said support and the electrical contact tabs thereon lie outside said cavity when said one face of the fixing element comes into contact with said portion of the second face of said support;

supplying thermal energy to said fixing element in order to adhere said one face of the fixing element to said support and the other of said two faces of the fixing element to said card body; and simultaneously with supplying said thermal energy, applying pressure to at least a portion of said first face of the support to decrease the thickness of said fixing element, until said contact tabs lie substantially in a plane defined by the main face of said card body and said fixing element provides secure adhesion, thereby retaining said decreased thickness of said fixing element.

2. A method according to claim 12, wherein said fixing element is constituted by a crushable matrix structure containing a thermally activatable adhesive.

3. A method according to claim 2, wherein said matrix structure constitutes a matrix which, in said step of applying pressure, is crushed substantially uniformly over the entire area of said fixing element.

4. A method according to claim 1, further including a step of depositing a drop of adhesive material in the bottom of said cavity prior to placing said electronic module in said cavity, and a step of activating said adhesive material in order to connect the bottom of said cavity to said electronic module.

5. A method according to claim 1, wherein said cavity includes a first housing provided with a bottom for receiving said semiconductor chip of the module, and a second housing opening out in a main face of said body in order to receive said module support, said second housing being connected to said first housing via a shoulder, and said fixing element being placed on said shoulder.

* * * * *